US006792115B1

(12) United States Patent
Vierthaler

(10) Patent No.: US 6,792,115 B1
(45) Date of Patent: Sep. 14, 2004

(54) APPARATUS FOR GENERATING HARMONICS IN AN AUDIO SIGNAL

(75) Inventor: Matthias Vierthaler, Freiburg (DE)

(73) Assignee: Micronas GmbH, Freiburg (DE)

( * ) Notice: Subject to any disclaimer, the term of this patent is extended or adjusted under 35 U.S.C. 154(b) by 544 days.

(21) Appl. No.: 09/716,167

(22) Filed: Nov. 17, 2000

(30) Foreign Application Priority Data

Nov. 18, 1999 (DE) ........................................ 199 55 696

(51) Int. Cl.[7] ................................................. H03G 3/00
(52) U.S. Cl. ........................................... 381/61; 381/98
(58) Field of Search ............................ 381/61, 98, 28, 381/62, 56, 58, 59, 103

(56) References Cited

U.S. PATENT DOCUMENTS

| | | | | |
|---|---|---|---|---|
| 4,150,253 A | | 4/1979 | Knoppel | 179/1 R |
| 4,700,390 A | | 10/1987 | Machida | 381/29 |
| 5,305,388 A | | 4/1994 | Konno | 381/102 |
| 5,359,665 A | | 10/1994 | Werrbach | 381/102 |
| 5,388,159 A | | 2/1995 | Sakata | 381/61 |
| 5,668,885 A | | 9/1997 | Oda | 381/98 |
| 5,754,666 A | * | 5/1998 | Nakagawa | 381/98 |
| 5,771,296 A | | 6/1998 | Unemura | 381/28 |
| 5,930,373 A | | 7/1999 | Shashoua et al. | 381/98 |
| 6,111,960 A | * | 8/2000 | Aarts et al. | 381/61 |
| 6,134,330 A | * | 10/2000 | De Poortere et al. | 381/61 |
| 6,215,879 B1 | * | 4/2001 | Dempsey | 381/61 |
| 6,275,593 B1 | * | 8/2001 | Garcia et al. | 381/98 |
| 6,456,718 B1 | * | 9/2002 | Aarts | 381/61 |

* cited by examiner

*Primary Examiner*—Xu Mei
(74) *Attorney, Agent, or Firm*—Gauthier & Connors LLP

(57) ABSTRACT

An apparatus for generating harmonics in an audio signal with an adder stage, which can add signals from a first signal line and a second signal line, such that an audio signal with harmonics can be tested at the output of the adder stage and such that a filter device and a nonlinear circuit device are situated in the second signal line, characterized in that a corner frequency of the filter device is adjustable.

14 Claims, 3 Drawing Sheets

APPARATUS FOR GENERATING HARMONICS IN AN AUDIO SIGNAL

BACKGROUND OF THE INVENTION

The invention relates to an apparatus and method for generating harmonics in an audio signal.

Methods and circuits for generating harmonics are used in devices for acoustic reproduction, such as television receivers, radio receivers, and stereo systems, to compensate the frequency response of the loudspeakers, in order to improve acoustic reproduction and also to prevent the device or the system from being overdriven.

A critical element in a device for acoustic reproduction is the loudspeaker, whose acoustic pressure, below a structure-based limit frequency, drops about 40 db per decade. This corresponds to the transmission function of a second-order filter. On the other hand, bass reflex and transmission line loudspeakers have transmission functions corresponding to a filter of higher order. The lower limit frequency typically lies between about 50 Hz and 200 Hz. The lower the limit frequency of a loudspeaker, the more expensive it is to produce. Consequently, economical devices such as TV sets and portable radio receivers are equipped with simpler loudspeakers, whose lower limit frequency is relatively high. To improve acoustic reproduction in the lower frequency range, the limit frequency is displaced downward by pre-amplifying the low frequencies. However, this can cause the final amplifier and the loudspeakers to be overdriven. To prevent the final amplifiers or loudspeakers from being overdriven and possibly even being destroyed, the output signal of the bass amplifier is fed back in such a way that the amplification of the lower frequencies is reduced for a large output signal. For example, U.S. Pat. No. 5,305,388 entitled "Bass Compensation Circuits For Use In Sound Reproduction Device" discloses such a method.

U.S. Pat. No. 5,359,665 entitled "Audio Bass Frequency Enhancement" discloses a circuit arrangement in which the audio signal is conducted via a first path directly to the first input of an adder, and conducted via a second path through a low-pass filter and an amplifier with variable amplification to a second input of the adder. The output of the amplifier is fed back via a signal level detector to its control input. This measure reduces overdrive of the final amplifier.

From psychoacoustics, it is known that a person can still clearly determine the fundamental frequency of a tone even if the fundamental frequency is not present in the spectrum, but only harmonics of the fundamental frequency. This psychoacoustic effect is utilized in that harmonics of the fundamental frequency are generated and are conducted to a loudspeaker whose limit frequency lies above this fundamental frequency. A listener thus thinks that he is hearing this low fundamental frequency, even though the loudspeaker does not radiate it. For example, a listener thinks that he is hearing a tone of 50 Hz when the loudspeaker in fact does not transmit this low tone, but only a tone of 250 Hz and a tone of 300 Hz. Advantageously, a listener subjectively perceives the difference of 50 Hz.

This effect is utilized when qualitatively simple loudspeakers with a high lower limit frequency of for example 120 Hz, are supposed to transmit for example a signal of 60 Hz. One then generates harmonics of the 60 Hz signal whose difference amounts to 60 Hz. The listener then actually thinks he is hearing a 60 Hz tone, although this tone is not radiated by the loudspeaker.

To generate the harmonics electronic circuits are required to determine the fundamental frequency in a mixture of audio signals, and to extract it in order to generate the harmonics of this fundamental frequency.

U.S. Pat. Nos. 5,668,885 and 5,771,296 describe the generation of harmonics by forming absolute values by a rectifier arrangement.

U.S. Pat. Nos. 4,150,253 and 4,700,390 describe the generation of harmonics by clipping (i.e., cutting off the amplitude of the fundamental frequency of the audio signal above a certain level).

In all these documents, filters with fixed corner frequencies are used to select the signals whose harmonics are to be generated.

If there is more than one signal in the selected frequency range (as is the case for real audio signals), which are composed of a frequency spectrum, then not only the harmonics of the existing signals are generated but also harmonics with an undesirable frequency, which consist of the sum of all the existing signal frequencies and their multiples. The result of this is that the tone finally radiated by the loudspeaker sounds very muddy.

Therefore, there is a need for an improved technique for generating harmonics.

SUMMARY OF THE INVENTION

Briefly, according to an aspect of the present invention, a system for generating harmonics in an audio signal includes a filtering device that is responsive to an audio input signal, and determines a dominant fundamental frequency component within the audio input signal and provides a filtered audio signal indicative thereof. A non-linear unit (e.g., a multiplier) responsive to the filtered audio signal generates harmonic frequency components of the dominant fundamental frequency and provides a non-linear unit output signal indicative thereof to a first bandpass filter that provides a first bandpass filtered signal. A summer sums the audio input signal and the first bandpass filtered signal to provide a system output signal that includes harmonics of the dominant frequency component.

In one embodiment, a system delimits as precisely as possible the signal frequency whose harmonics are to be generated with a variable filter (e.g., a band-pass filter).

A second embodiment generates harmonics by using the nth power (e.g., two) of the input signal to generate the (n−1) harmonic. If n is equal to two, the fundamental frequency of the input signal is squared and the first harmonic is generated. Fundamental frequency is here understood to designate the dominating frequency contained in the audio signal, within a frequency range of for example less than 120 Hz. Generating harmonics by potentiation is much "cleaner" compared to the known clipping or rectifying process. The amplitude of the signal is corrected before or after potentiation.

Advantageously, a system of the present invention creates an improved audio impression for a listener when he hears an audio signal that is radiated by loudspeakers with a relatively high lower corner frequency.

These and other objects, features and advantages of the present invention will become apparent in light of the following detailed description of preferred embodiments thereof, as illustrated in the accompanying drawings

DETAILED DESCRIPTION OF THE INVENTION

Figure 1:
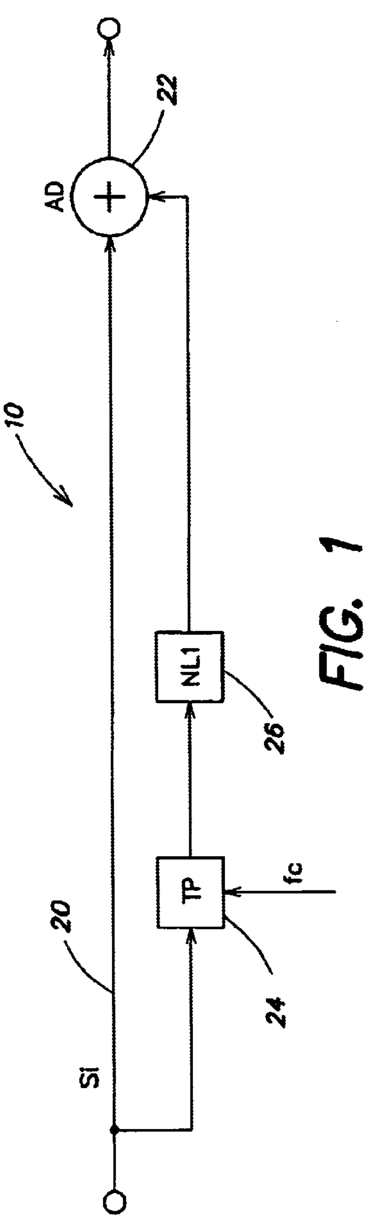
FIG. 1 is a block diagram illustration of a first inventive circuit arrangement with a device for delimiting the lower fundamental frequency.

FIG. 1 illustrates a circuit arrangement 10, in which an audio input signal si on a line 20 is conducted to the input terminal of an adder stage 22. The output of the adder stage 22 is connected for example to a loudspeaker or to an amplifier (not shown). The input signal si is also conducted via a filter device, here a low-pass filter 24 or a band-pass filter, to a nonlinear circuit unit 26, which generates harmonics from the filtered signal. The filter arrangement is used to determine the dominating fundamental frequency in the input signal si on the line 20. From this, the nonlinear circuit 26 generates harmonics and conducts these to a second input terminal of the adder stage 22. It is essential that the corner frequency fc of the filter 24 is adjustable.

Figure 2:
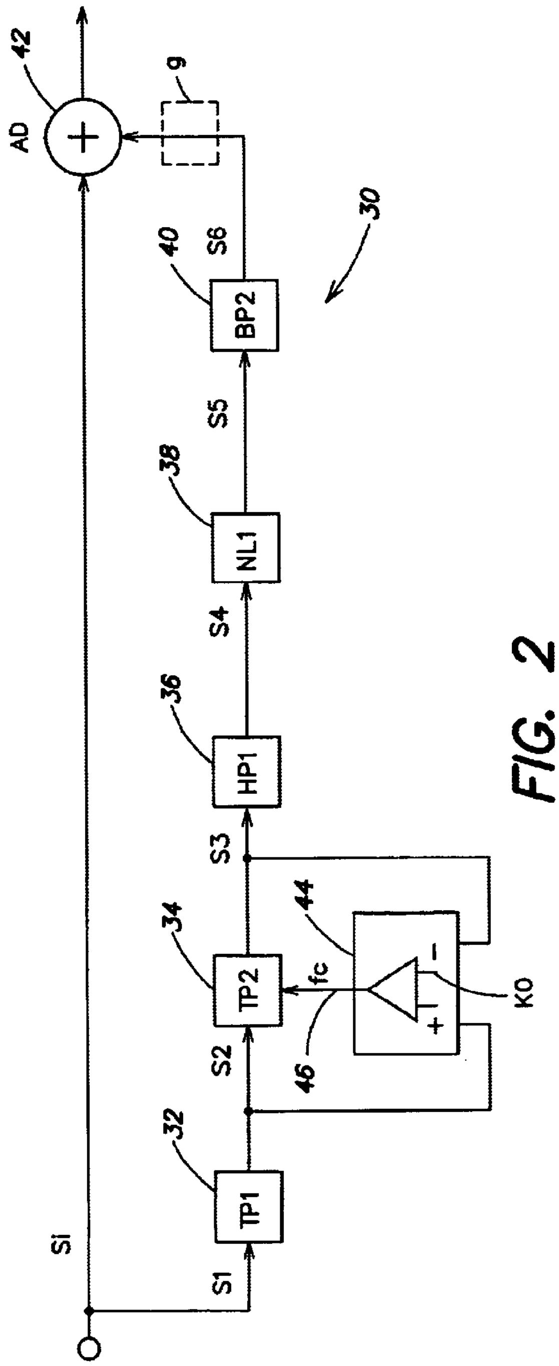
FIG. 2 is a somewhat more detailed block diagram illustration of a circuit embodiment than FIG. 1 for generating harmonics in an audio signal.

FIG. 2 illustrates a somewhat more detailed circuit embodiment than FIG. 1 for generating harmonics in an audio signal. The filter includes a series circuit of a first low-pass filter 32, a following second low-pass filter 34 and a subsequent high-pass filter 36. The signals at the respective inputs are designated by s1, s2, and s3. The high-pass filter 36 provides an output signal s4 that is input to a nonlinear circuit unit 38, which provides an output signal s5 to a bandpass filter 40. The filter 40 generates a bandpassed output signal s6, which may be amplified by a gain factor g and input to an adder stage 42.

The low-pass filter 32 has a fixed corner frequency (e.g., 200 Hz). The low-pass filter 34 has a variable corner frequency fc. The high-pass filter 36 has for example a constant corner frequency of 50 Hz, or of k*fc, with k chosen to be less than one. The band-pass filter 40 has for example a center frequency that is proportional to fc.

The corner frequency fc of the low-pass filter 34 can be adjusted in response to the signals s2 and s3. Specifically, the signals s2 and s3 are input to a comparator 44 that provides a control signal on a line 46 that sets the corner frequency fc for the low pass filter 34.

The circuit arrangement of FIG. 2 functions as follows. The low frequencies within the spectrum of the input signal s1 are pre-selected in the low-pass filter 32. Further filtering takes place in the low-pass filter 34. The corner frequency fc is adjusted so that the following holds:

$$s3=q*s2,\ \text{where } 0<q<1.$$

(Remark: "*" designates multiplication)

In the above formula, s3 and s2 can designate the signal amplitudes of the signals s3 and s2 or also their signal energies.

The corner frequency fc is thus adjusted so that a certain portion q of the signal s2 is present at the output of the low-pass filter 34. Only the lowest frequency components of the input signal si (note si=s1) can thus pass. Other interfering signal frequencies are filtered out.

The corner frequency fc can be determined for example by the following:

$$fc=fc+df,\ \text{if } s3<q*s2$$

$$fc=fc-df,\ \text{if } s3>q*s2.$$

Here df determines the rate of conversions of the rule and is advantageously chosen equal to or less than 1 Hz. That is, the low frequency range of the audio input signal si is queried (e.g., in 1 Hz steps), and the frequency is determined at which the signal has the greatest amplitude or energy. This frequency is then the desired fundamental frequency, from which harmonics will be generated in the nonlinear unit 38.

The signal s3 is high-pass filtered in the high-pass filter 36. The corner frequency of the high-pass filter 36 can either be constant or selected as a function of fc. Undesired frequencies in the signal s5 are removed by the band-pass filter 40. The center frequency of the band-pass filter 40 may be adjusted as a function of the corner frequency fc. For example, if the nonlinear unit 38 generates mainly signals with the first harmonic (i.e., double the signal frequency of the fundamental) the center frequency can be chosen such that fbp=2*fc, where fbp is the center frequency of the bandpass filter 40.

The signal s6 at the output of the band-pass filter BP2 is preferably amplified by a factor g before it is added to the signal si in the adder stage 42.

Figure 3:
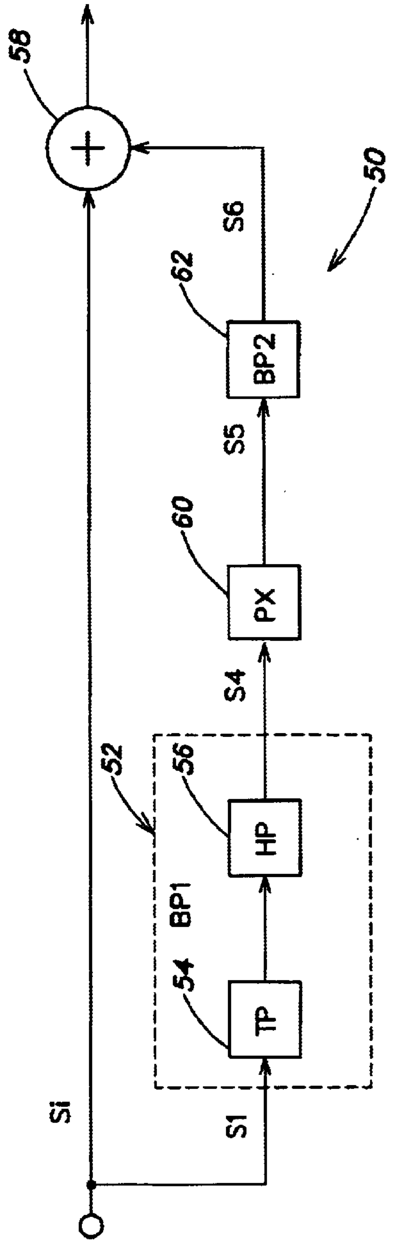
FIG. 3 is a block diagram illustration of a second inventive circuit arrangement with a device for potentiating the fundamental frequency signal.

FIG. 3 illustrates a circuit arrangement 50 in which a band-pass filter arrangement 52 that includes a low-pass filter 54 and a subsequent high-pass filter 56, is situated in the signal branch which does not directly lead to adder stage 58. The band-pass filter 52 provides an output signal s4 that represents the fundamental frequency. The filter arrangement 52 preferably is the one shown in connection with FIGS. 1 and 2.

The signal s4 is squared in the nonlinear unit 60 to generate the first harmonic. The nonlinear unit 60 provides an output signal s5 that is input to a band-pass filter 62, which provides a bandpassed signal s6. The bandpassed signal s6 is conducted to the adder stage 58, either directly or first multiplied by a factor g. Rather than being squared, the signal s4 may be raised by a power of 3 or 4, or a higher integer value.

Figure 4:
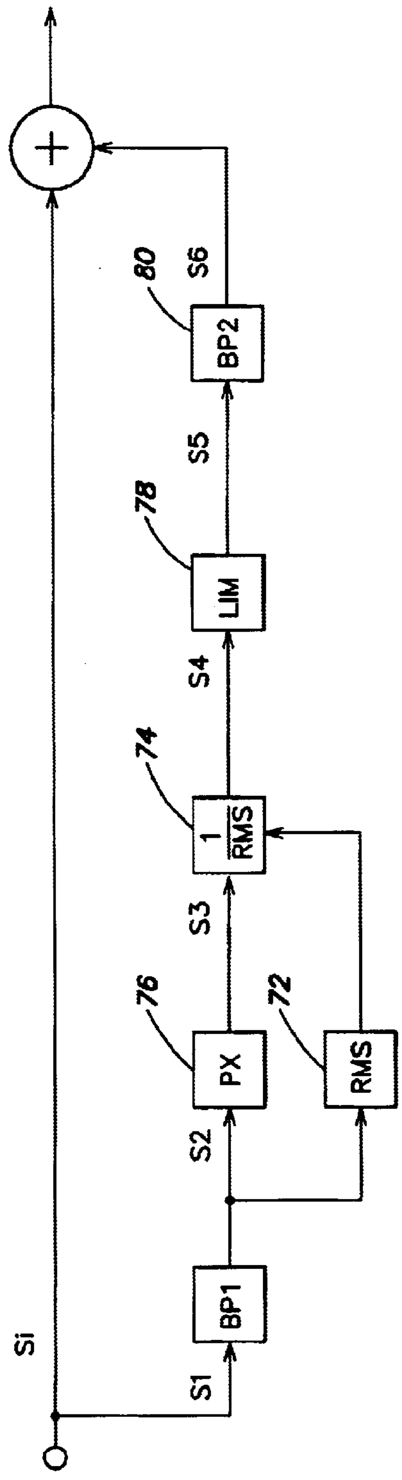
FIG. 4 is a block diagram illustration of FIG. 3 in more detail.
Figure 5:
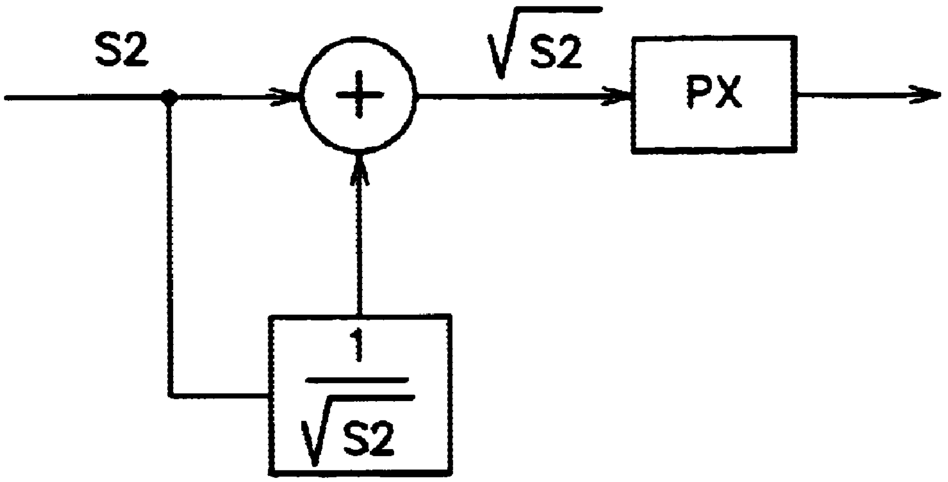
FIG. 5 is a block diagram illustration of variant of the arrangement of FIG. 4.

FIGS. 4 and 5 are alternative embodiments of the circuit arrangement of FIG. 3, because there the signal is normalized before (FIG. 4) or after (FIG. 5) potentiation.

Referring to FIG. 4, in this embodiment the signal s2 is input to an RMS detector 72. The output from the RMS detector 72 is input to a divider stage 74, which also receives the output signal s3 from unit 76. The divider stage 74 divides its output signal s3 by the value of the output signal from the RMS detector 72. The divider stage 74 is followed by a limiter 78, whose output is connected to a band-pass filter 80.

By being normalized with the RMS value of the signal which is calculated by the RMS detector 72, the signal s3 again recovers its original amplitude, in accordance with $$s4=(s2^2)/RMS(s2).$$

The detector RMS has a time constant tau of for example 0.2 seconds. Since the amplitude of s3 under some circumstances can rise much faster than the RMS value, which has a higher time constant, very high values can occur in the signal s4. Consequently, the values of the signal s4 are limited to a permissible value in the limiter 78. The generated harmonics are again limited in the band-pass filter 80 with the center frequency fbp2, and then in the adder stage AD are added to the audio signal si.

In the embodiments set forth in FIGS. 3–5, the nonlinear unit 76 preferably squares the signal s2 to generate first-order harmonics. Therefore, in these embodiments the center frequency fbp2 of the second band-pass filter (62, 80) should be chosen to be twice the center frequency fbp1 of the first band-pass filter (i.e., BPL1).

However, higher-order harmonics can be generated just as well if the nonlinear unit is appropriately designed for this. For potentiating by a factor of 3, one would have to make fbp2=fbp1*3, since the frequency was tripled.

The framework of the invention also comprises parallel connection of several of the circuits presented above, in order to simultaneously generate several harmonics (e.g., the first and the second harmonic).

Although the present invention has been shown and described with respect to several preferred embodiments thereof, various changes, omissions and additions to the form and detail thereof, may be made therein, without departing from the spirit and scope of the invention.

What is claimed is:

1. A system for generating harmonics in an audio signal, comprising:

a filtering device that is responsive to an audio input signal, and determines a dominant fundamental frequency component within said audio input signal and provides a filtered audio signal indicative thereof;

a non-linear unit responsive to said filtered audio signal, that generates harmonic frequency components of the dominant fundamental frequency and provides a non-linear unit output signal indicative thereof;

a first bandpass filter that is responsive to said non-linear unit output signal and provides a first bandpass filtered signal; and a summer that sums said audio input signal and said first bandpass filtered signal to provide a system output signal that includes harmonics of the dominant frequency component.

2. The system of claim 1, wherein said non-linear unit comprises means for squaring said filtered audio signal and for providing said non-linear output signal.

3. The system of claim 1, wherein said non-linear unit comprises means responsive to said filtered audio output signal for raising the power of said filtered audio signal by an integer value.

4. The system of claim 1, wherein said filtering device comprises:

a first low pass filter that is responsive to said audio input signal and provides a first filtered signal;

an adjustable second low pass filter that is responsive to said first filtered signal and a command signal, wherein said command signal sets the break frequency for said adjustable second low pass filter that provides a second filtered signal; and a high pass filter that is responsive to said second filtered signal and provides a signal indicative of said filtered audio signal.

5. The system of claim 4, wherein said adjustable second low pass filter comprises means responsive to said first filtered signal and said second filtered signal, for determining said command signal.

6. The system of claim 5, wherein said means for determining said command signal comprises a comparator that compares said first and second filtered signals.

7. The system of claim 5, wherein said first bandpass filter is responsive to said command signal to set the center frequency of the pass band of said first bandpass filter.

8. The system of claim 1, wherein said filtering device comprises:

a second band pass filter that is responsive to said audio input signal and provides a second bandpass filtered signal;

an RMS detector that is responsive to said second bandpass filtered signal and provides an RMS output signal;

a multiplier that is responsive to said second bandpass filtered signal, and raises the power of said second bandpass filtered signal and provides a multiplier output signal indicative thereof; and a divider that divides said multiplier output signal by said RMS output signal and provides a divider output signal that is indicative of said filtered audio signal.

9. A system for generating harmonics in an audio signal, comprising:

a filtering device that is responsive to an audio input signal, and determines a dominant fundamental frequency component within said audio input signal and provides a filtered audio signal indicative thereof;

a multiplier circuit that is responsive to said filtered audio signal and raises the power of said filtered audio signal by an integer value of at least two to generate harmonic frequency components of the dominant fundamental frequency and provide a multiplier circuit output signal indicative thereof;

means for filtering responsive to said multiplier circuit output signal for providing a first bandpass filtered signal; and a circuit that sums said audio input signal and said first bandpass filtered signal to provide a system output signal that includes harmonics of the dominant frequency component.

10. A system for generating harmonics in an audio signal, comprising:

a filtering device that is responsive to an audio input signal, and determines a dominant fundamental frequency component within said audio input signal and provides a filtered audio signal indicative thereof;

a multiplier responsive to said filtered audio signal, that generates harmonic frequency components of the dominant fundamental frequency and provides a multiplier output signal indicative thereof;

a first bandpass filter responsive to said multiplier output signal for providing a first bandpass filtered signal; and a summing circuit that sums said audio input signal and said first bandpass filtered signal to provide a system output signal that includes harmonics of the dominant frequency component.

11. The system of claim 10, wherein said multiplier raises the power of said filtered audio signal by an integer value; and said filtering device comprises (i) a first low pass filter that is responsive to said audio input signal and provides a first filtered signal;

(ii) an adjustable second low pass filter that is responsive to said first filtered signal and a command signal, wherein said command signal sets the break frequency for said adjustable second low pass filter that provides a second filtered signal; and (iii) a high pass filter that is responsive to said second filtered signal and provides a signal indicative of said filtered audio signal.

12. The system of claim 11, wherein said adjustable second low pass filter comprises means responsive to said first filtered signal and said second filtered signal, for determining said command signal.

13. The system of claim 12, wherein said means for determining said command signal comprises a comparator that compares said first and second filtered signals.

14. The system of claim 10, wherein said first bandpass filter is responsive to said command signal to set the center frequency of the pass band of said first bandpass filter.

* * * * *